US009653666B2

(12) United States Patent
Peng et al.

(10) Patent No.: US 9,653,666 B2
(45) Date of Patent: May 16, 2017

(54) LIGHT-EMITTING DEVICE AND THE MANUFACTURING METHOD THEREOF

(71) Applicant: EPISTAR CORPORATION, Hsinchu (TW)

(72) Inventors: Wei-Chih Peng, Hsinchu (TW); Jhih-Jheng Yang, Hsinchu (TW); Victor Liu, Hsinchu (TW); Hong-Yi Lei, Hsinchu (TW); Min Hsun Hsieh, Hsinchu (TW)

(73) Assignee: Epistar Corporation, Hsinchu (TW)

(*) Notice: Subject to any disclaimer, the term of this patent is extended or adjusted under 35 U.S.C. 154(b) by 0 days.

(21) Appl. No.: 15/078,761

(22) Filed: Mar. 23, 2016

(65) Prior Publication Data

US 2016/0204310 A1 Jul. 14, 2016

Related U.S. Application Data

(60) Division of application No. 14/282,927, filed on May 20, 2014, now abandoned, which is a
(Continued)

(51) Int. Cl.
*H01L 33/20* (2010.01)
*H01L 33/60* (2010.01)
(Continued)

(52) U.S. Cl.
CPC ............ *H01L 33/60* (2013.01); *H01L 33/007* (2013.01); *H01L 33/0095* (2013.01);
(Continued)

(58) Field of Classification Search
CPC ............ H01L 33/20; H01L 2933/0058; H01L 21/0243; H01L 2933/0091; H01L 33/58;
(Continued)

(56) References Cited

U.S. PATENT DOCUMENTS 7,977,223 B2 7/2011 Byun et al.
2008/0048206 A1* 2/2008 Lee ..................... H01L 33/387
257/103

(Continued)

FOREIGN PATENT DOCUMENTS

CN 102034907 A 4/2011

OTHER PUBLICATIONS

Sheu et al, "Enhanced Light Output of GaN-Based Light-Emitting Diodes With Embedded Voids Formed on Si-Implanted GaN Layers," IEEE Electron Device Letters, Oct. 2011, pp. 1400-1402, vol. 32, No. 10.

*Primary Examiner* — Davienne Monbleau
*Assistant Examiner* — Leslie Pilar Cruz
(74) *Attorney, Agent, or Firm* — Muncy, Geissler, Olds & Lowe, P.C.

(57) ABSTRACT

A method of manufacturing a light-emitting device comprises the steps of: providing a substrate; forming a mask block contacting the substrate and exposing a portion of the substrate; implanting an ion into the portion of the substrate to form an ion implantation region; and forming a semiconductor stack on the substrate such that multiple cavities are formed between the semiconductor stack and the ion implantation region; wherein the mask block comprises a material made of metal or oxide.

15 Claims, 18 Drawing Sheets

Related U.S. Application Data continuation-in-part of application No. 13/918,374, filed on Jun. 14, 2013, now Pat. No. 9,362,452.

(51) Int. Cl.
    *H01L 33/22*     (2010.01)
    *H01L 33/00*     (2010.01)

(52) U.S. Cl.
    CPC .......... *H01L 33/22* (2013.01); *H01L 33/0075* (2013.01); *H01L 2933/0058* (2013.01); *H01L 2933/0091* (2013.01)

(58) Field of Classification Search
    CPC ............... H01L 21/02647; H01L 33/22; H01L 2933/0083; H01L 33/025; H01L 33/10
    See application file for complete search history.

(56) References Cited

U.S. PATENT DOCUMENTS

| | | |
|---|---|---|
| 2009/0078954 A1 | 3/2009 | Shim et al. |
| 2010/0065865 A1* | 3/2010 | Byun .................. H01L 21/0237 257/94 |
| 2010/0102353 A1 | 4/2010 | Park |
| 2011/0108798 A1* | 5/2011 | Song .................. H01L 33/0079 257/13 |
| 2012/0018758 A1 | 1/2012 | Matioli et al. |
| 2012/0289031 A1* | 11/2012 | Evans ............... H01L 21/02381 438/478 |

* cited by examiner

US 9,653,666 B2

LIGHT-EMITTING DEVICE AND THE MANUFACTURING METHOD THEREOF

RELATED APPLICATIONS

This application is a division application of U.S. patent application Ser. No. 14/282,927, filed on May, 20, 2014, which is a continuation in-part application of U.S. patent application Ser. No. 13/918,374, filed on Jun. 14, 2013, and for which priority is claimed under 35 U.S.C. §120, the entire contents of all of which are hereby incorporated by reference.

TECHNICAL FIELD

The application relates to a light-emitting device and, in particular, relates to a light-emitting device including scattering cavities therein resulting from ion implantation.

DESCRIPTION OF BACKGROUND ART

The lighting theory and structure of light-emitting diode (LED) is different from that of conventional lighting source. An LED has advantages as a low power loss, a long life-time, no need for warming time, and fast responsive time. Moreover, it is small, shockproof, suitable for mass production, so LEDs are widely adopted in the market. For example, LEDs can be used in optical display apparatus, laser diodes, traffic lights, data storage devices, communication devices, illumination devices, medical devices, and so on.

A light-emitting device may include a substrate, a light-emitting stack including an n-type semiconductor layer, an active layer, and a p-type semiconductor layer. The light-emitting stack may have roughened structure on the surface or the substrate thereof to enhance light extraction.

In addition, the light emitting device can be further connected to other components in order to form a light emitting apparatus. The light-emitting device may be mounted onto a submount with the side of the substrate, or a solder bump or a glue material may be formed between the submount and the light-emitting device, therefore a light-emitting apparatus is formed. Besides, the submount further comprises the circuit layout electrically connected to the electrode of the light-emitting device via an electrical conductive structure such as a metal wire.

SUMMARY OF THE DISCLOSURE

A method of manufacturing a light-emitting device comprises the steps of: providing a substrate; forming a mask block contacting the substrate and exposing a portion of the substrate; implanting an ion into the portion of the substrate to form an ion implantation region; and forming a semiconductor stack on the substrate such that multiple cavities are formed between the semiconductor stack and the ion implantation region; wherein the mask block comprises a material made of metal or oxide.

DETAILED DESCRIPTION OF PREFERRED EMBODIMENTS

First Embodiment

Figure 1A:
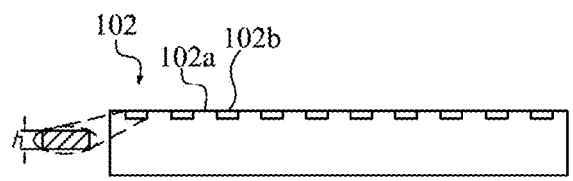
FIGS. 1A to 1F show a manufacturing method of a light-emitting device in accordance with a first embodiment of the present application.
Figure 1B:
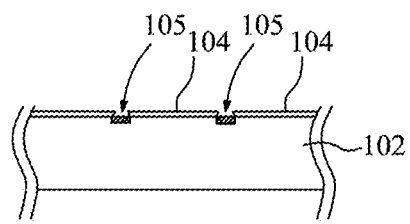

Referring to FIGS. 1A to 1E, a manufacturing method of a light-emitting device in accordance with a first embodiment of the present application is disclosed. As shown in FIG. 1A, a substrate 102 including an upper surface 102a is provided, and an ion implantation region 102b can be formed on the upper surface 102a. The ion implantation region 102b can be formed by implanting ions into the substrate 102, and the ion can be Ar ion, Si ion, O ion, N ion, C ion and the combination thereof, and in the embodiment, the ion can be Ar. The ion implantation region 102b can have a thickness h smaller than 1 μm, preferably between 10 nm to 50 nm, and the ion implantation region 102b can be formed with an ion implantation dose between 1E15 ions/cm2 and 1E17 ions/cm2. The substrate 102 can be a single-layer and single-crystalline substrate including sapphire, Si or SiC. The ion implantation region 102b with a dot-like pattern forms amorphization on partial area of the upper surface 102a of the substrate 102. In the embodiment, the substrate 102 is sapphire, and a nitride based semiconductor can be grown on the upper surface 102a. Before forming the ion implantation region 102b, a mask (not shown) with a pattern can be formed on the upper surface 102a, and ion implantation region 102b can be formed in accordance with the pattern of the mask. As shown in FIG. 1B, the substrate 102 can be disposed in an MOCVD chamber (not shown), then a semiconductor layer 104 is formed on the upper surface 102a of the substrate 102 by epitaxial growth.

Figure 1C:
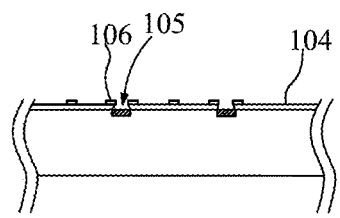
Figure 1D:
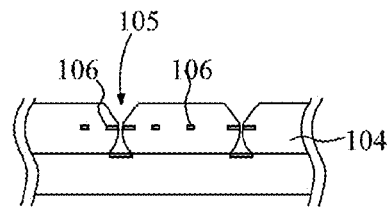
Figure 1E:
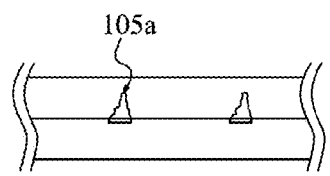
Figure 1F:
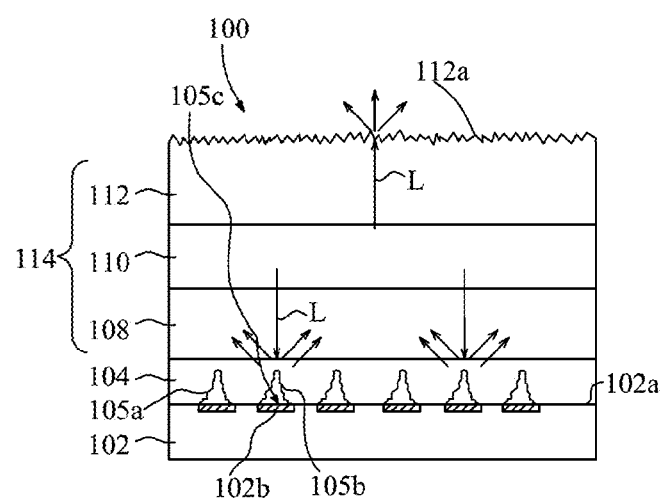

Because of the amorphization of the ion implantation regions 102b, the epitaxial growth rate on a region other than the implantation regions 102b is faster than that on the implantation regions 102b, and therefore a plurality of openings 105 is formed. The semiconductor layer 104 serves as a buffer layer to reduce the lattice mismatch between the substrate 102 and a light-emitting stack, and the material of the semiconductor layer 104 can be an undoped GaN or un-intentionally doped GaN. Along the growth of the semiconductor layer 104, the cross-sectional area of each of the openings 105 is gradually smaller from bottom to top. A seed layer (not shown) such as MN can be formed on the upper surface 102a of the substrate 102 before the semiconductor layer 104 is formed. As shown in FIG. 1C, epitaxial growth of the semiconductor layer 104 is paused after the semiconductor layer 104 reach a thickness of about 200 nm to 600 nm, then a barrier section 106 can be formed on the semiconductor layer 104 by deposition in the MOCVD chamber. The amount of the deposited barrier section 106 is small so the barrier section 106 covers only partial regions of the semiconductor layer 104. The barrier section 106 can be formed of non-crystalline material such as SiNx, and in accordance with the existence of the openings 105, the barrier section 106 can surround each of the openings from top view. As shown in FIG. 1D, after forming the barrier section 106, the epitaxial growth of the semiconductor layer 104 is resumed. The epitaxial growth of the semiconductor layer 104 nearby each opening 105 includes a growing direction laterally toward the opening 105, and therefore the opening 105 can be eventually closed by the semiconductor layer 104. Because of the barrier section 106 embedded in the semiconductor layer 104, the growing direction of the semiconductor layer 104 nearby the openings 105 can be temporarily changed so the openings 105 can be developed to a desired height before forming a closed end. The process of embedding the barrier section 106 in the semiconductor layer 104 can be performed for 1 to 100 cycles, and the semiconductor layer 104 can be grown with a thickness of between 10 nm to 50 nm during each cycle. As shown in FIG. 1E, the openings 105 in FIG. 1D are closed when the semiconductor layer 104 is grown to reach a thickness of about 2.5 μm to 3 μm, and a plurality of scattering cavities 105a can be formed. As shown in FIG. 1F, a light-emitting stack 114 which includes an n-type semiconductor layer 108, an active layer 110, and a p-type semiconductor layer 112 in the embodiment can be formed on the semiconductor layer 104. The electrons provided from the n-type semiconductor layer 108 and the holes provided from the p-type semiconductor layer 112 combine in the active layer 110 to emit light L under an external electrical driving current, and light L emitted from the active layer 110 can be scattered by the scattering cavities 105a so the light-extraction of the light-emitting device 100 can be enhanced. In the embodiment, the ion implantation region 102b is amorphous, and the scattering cavities 105a are directly on the ion implantation region 102b. Each of the scattering cavities 105a includes a bottom surface 105b being a region of the upper surface 102a of the substrate 102 and a side surface 105c connected to the bottom surface 105b. The p-type semiconductor layer 112 can have an uneven upper surface 112a for scattering the light L from the active layer 110. The light-emitting stack 114 can include nitride based semiconductor, and in the embodiment, the light-emitting stack 114 can be GaN. The form of each of the cavities 105a can be cone, pyramid or other forms having a wide bottom and a narrow top.

Second Embodiment

Figure 2:
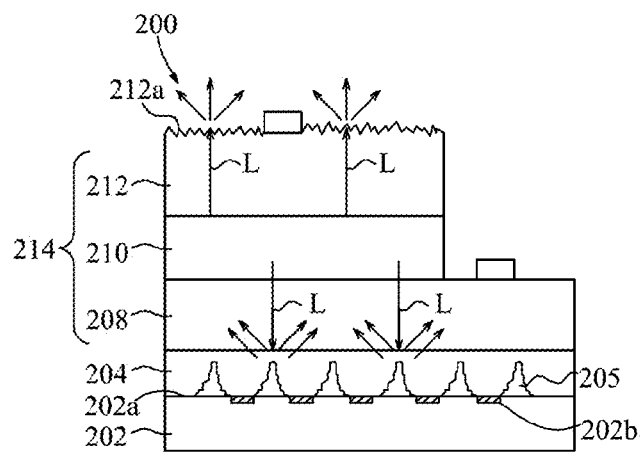
FIG. 2 shows a light-emitting device in accordance with a second embodiment of the present application.
Figure 3A:
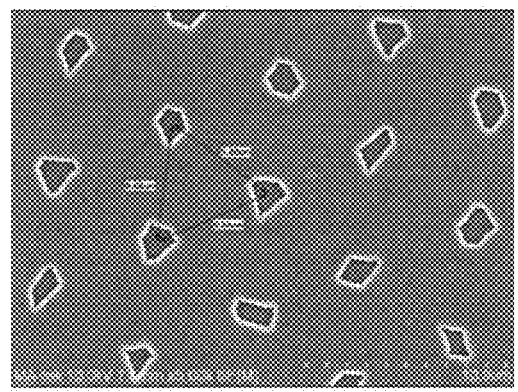
FIGS. 3A to 3F show three groups of scanning electron microscope photos in accordance with three different densities of the scattering cavities disclosed in the embodiments of the present application.
Figure 3B:
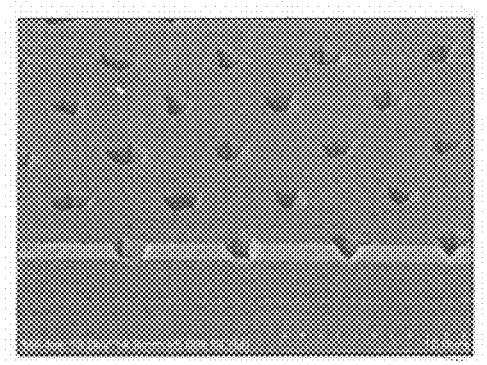
Figure 3C:
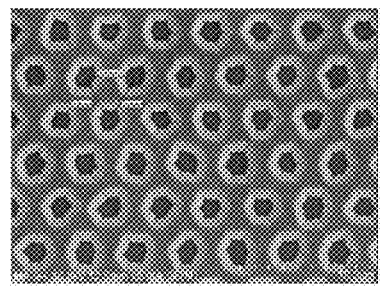
Figure 3D:
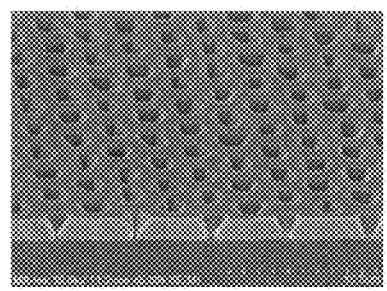
Figure 3E:
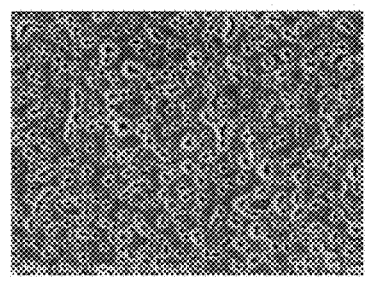
Figure 3F:
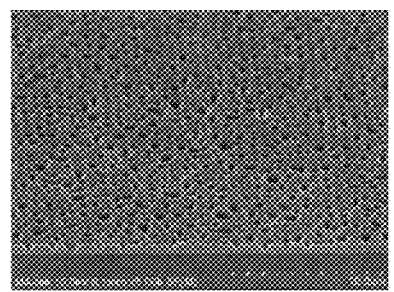

Referring to FIG. 2, a light-emitting device in accordance with a second embodiment of the present application is disclosed. A light-emitting device 200 includes: a substrate 202 including an upper surface 202a; an ion implantation region 202b formed on the upper surface 202a; a semiconductor layer 204 formed on the upper surface 202a; a light-emitting stack 214 formed on the semiconductor layer 204; and a plurality of scattering cavities 205 formed between the semiconductor layer 204 and the upper surface 202a in accordance with the ion implantation region 202b and configured to scatter the light L emitted from the light-emitting stack 214. The difference between the embodiment and the first embodiment is that the ion implantation region 202b forms a crystallized region for epitaxial growth and has a mesh-like pattern from top view, and the scattering cavities 205 are formed on the upper surface 202a rather than the ion implantation region 202b. In the embodiment, the light-emitting stack 214 includes an n-type semiconductor layer 208 formed on the semiconductor layer 204, an active layer 210 formed on the n-type semiconductor layer, and a p-type semiconductor layer 212 formed on the active layer 210. The p-type semiconductor layer 212 includes an uneven upper surface 212a being a primary surface for extracting light L emitted from the active layer 210, and the roughness of the uneven upper surface 212a is for scattering light L emitted from the active layer 210.

Referring to FIGS. 3A to 3F, a couple sets of scanning electron microscope photos shows different densities of the scattering cavities disclosed in the embodiments of the present application are shown. FIGS. 3A and 3B, FIGS. 3C and 3D, and FIGS. 3E and 3F represent three sets of different densities of the scattering cavities, respectively. The scattering cavities are arranged in hexagonal close-packed with a predetermined pitch between two adjacent scattering cavities.

Third Embodiment

Figure 4A:
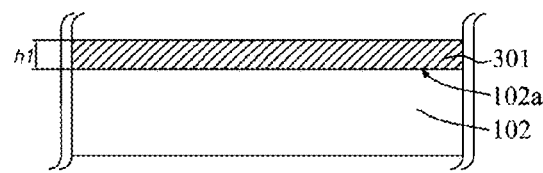
FIGS. 4A to 4D show a manufacturing method of a light-emitting device in accordance with a third embodiment of the present application.
Figure 4B:
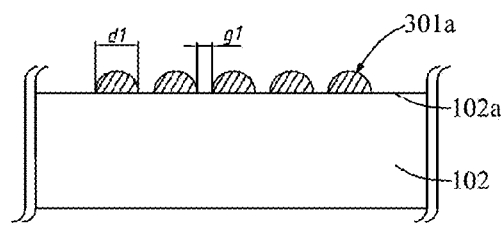
Figure 4C:
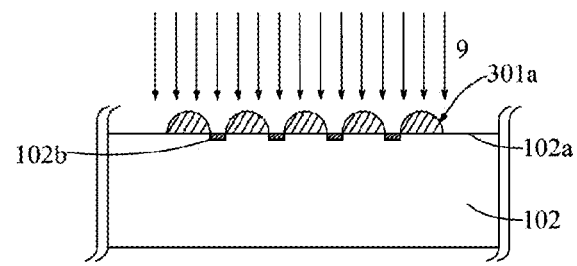
Figure 4D:
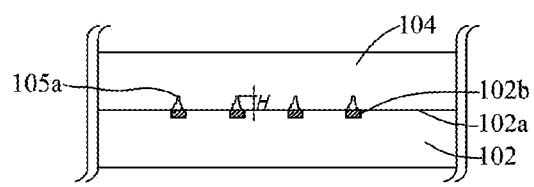

Referring to FIGS. 4A to 4D, a method of forming a plurality of scattering cavities between a substrate 102 and a semiconductor layer 104 in accordance with the third embodiment of the present application is disclosed. As FIG. 4A shows, a metal film 301 is formed on an upper surface 102a of the substrate 102 by PVD or CVD, wherein the upper surface 102a is planar. The material of the metal film 301 comprises Au, Ag, Ni, or Al, and the metal film 301 has a thickness h1 between 50~100 nm. Then, as FIG. 4B shows, the metal film 301 can be applied a heat treatment to form multiple metal particles 301a on the upper surface 102a and reveal a portion of the upper surface 102a, wherein the heat treatment comprises heating the metal film 301 to 600~800° C., maintaining the metal film 301 in a temperature of 600~800° C. for about 30~60 seconds and cooling the metal film 301 to about 200° C. by using nitrogen gas. When the metal film 301 is heated, the molecules of the metal film 301 are attracted to each other due to the cohesive force and become semi-molten metal, which is able to form the multiple metal particles 301a. An interval g1 between any two of the neighboring metal particles 301a is smaller than 1 μm, and the particle size d1 of the metal particle 301a is between 50~500 nm. The interval g1 between any two of the neighboring metal particles 301a and the particle size d1 of the metal particle 301a can be controlled by the period of maintaining the metal film 301 in a temperature of 600~800° C. As the period of maintaining the metal film 301 in a temperature of 600~800° C. is shorter, the interval g1 and the particle size d1 are smaller. As FIG. 4C shows, ions 9 are implanted into the substrate 102. The multiple metal particles 301a can act as a mask to the ions 9 which are implanted to the portion of the upper surface 102a exposed from the multiple metal particles 301a to form ion implantation regions 102b. The ion can be Ar ion, Si ion, O ion, N ion, C ion and the combination thereof. As FIG. 4D shows, the multiple metal particles 301a are removed by wet etching, and a semiconductor layer 104 is formed on the upper surface 102a by epitaxial growth. Because of the amorphization of the ion implantation regions 102b, the epitaxial growth rate on a region other than the implantation regions 102b is faster than that on the implantation regions 102b, and therefore multiple openings are formed on the implantation regions 102b. As the semiconductor layer 104 is grown to reach a thickness of about 2.5 μm to 3 μm, the multiple openings are closed to form multiple scattering cavities 105a between the substrate 102 and the semiconductor layer 104 and on the ion implantation regions 102b. The height H of the scattering cavity 105a, which is smaller than 1 μm, can be controlled by the category, dose and energy of the ions 9.

Fourth Embodiment

Figure 5A:
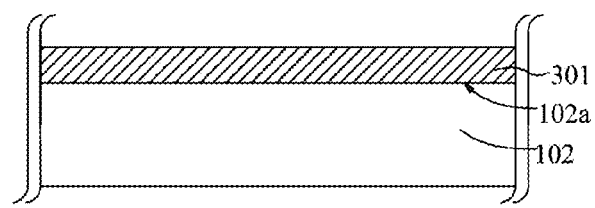
FIGS. 5A to 5E show a manufacturing method of a light-emitting device in accordance with a fourth embodiment of the present application.
Figure 5B:
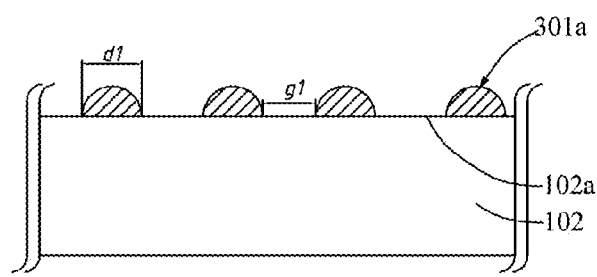
Figure 5C:
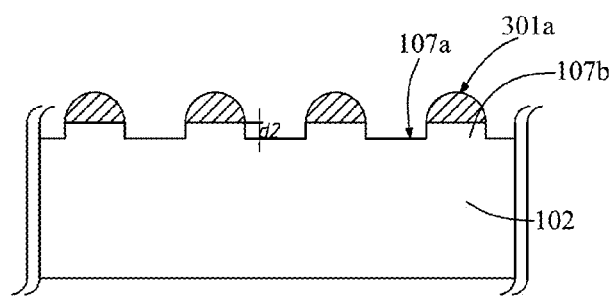
Figure 5D:
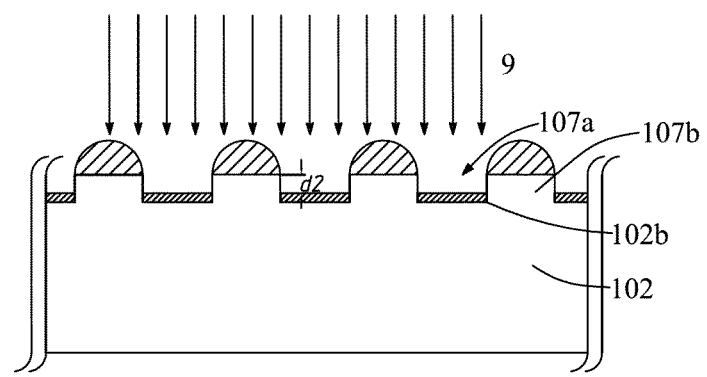
Figure 5E:
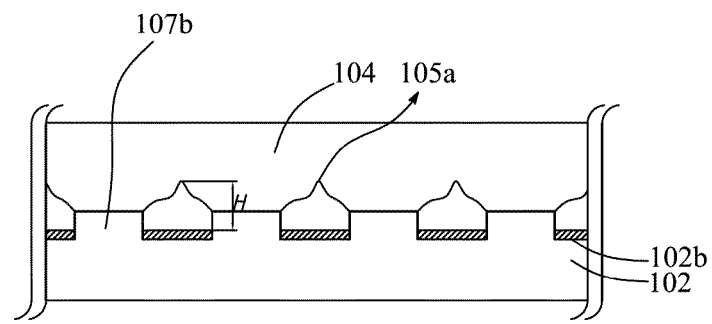

Referring to FIGS. 5A to 5E, a method of forming a plurality of scattering cavities between a substrate 102 and a semiconductor layer 104 in accordance with the fourth embodiment of the present embodiment is disclosed. As FIG. 5A shows, a metal film 301 is formed on the upper surface 102a of the substrate 102 by PVD or CVD, wherein the upper surface 102a is planar. The material of the metal film 301 comprises Au, Ag, Ni, or Al, and the metal film 301 has a thickness h1 between 50~100 nm. Then, as FIG. 5B shows, a heat treatment can be applied to the metal film 301 to form multiple metal particles 301a on the upper surface 102a and reveal a portion of the upper surface 102a, wherein the heat treatment comprises heating the metal film 301 to 600~800° C., maintaining the metal film 301 in a temperature of 600~800° C. for about 30~60 seconds and cooling the metal film 301 to about 200° C. by using nitrogen gas. When the metal film 301 is heated, the molecules of the metal film 301 are attracted to each other due to the cohesive force and become semi-molten metal, which is able to form the multiple metal particles 301a. An interval g1 between any two of the neighboring metal particles 301a is smaller than 1 μm, and the particle size of the metal particle 301a is between 50~500 nm. The interval g1 between any two of the neighboring metal particles 301a and the particle size d1 of the metal particle 301a can be controlled by the period of maintaining the metal film 301 in the temperature of 600~800° C. As the period of maintaining the metal film 301 in the temperature of 600~800° C. is shorter, the interval g1 and the particle size d1 are smaller. As FIG. 5C shows, a concave region 107a between the metal particles 30 is formed by etching the portion of the upper surface 102a exposed from the multiple metal particles 301a, and the portion of the upper surface 102a under the multiple metal particles 301a forms multiple micro-protrusions 107b, wherein the etching process comprises dry etching, such as RIE and ICP, or wet etching. The concave region 107a has a depth d2 usually smaller than 30 nm which can be controlled by the etching time. The multiple micro-protrusions 107b are randomly arranged over the upper surface 102a. As FIG. 5D shows, ions 9 is implanted into the substrate 102. The multiple metal particles 301a can act as a mask to the ions 9 which can be implanted to the portion of the upper surface 102a exposed from the multiple metal particles 301a to form ion implantation regions 102b in the concave portion 107a, instead of the multiple micro-protrusions 107b. The ion can be Ar ion, Si ion, O ion, N ion, C ion and the combination thereof. As FIG. 5E shows, the multiple metal particles 301a are removed by wet etching and a semiconductor layer 104 is formed on the upper surface 102a by epitaxial growth. Because of the amorphization of the ion implantation regions 102b, the epitaxial growth rate on a region other than the implantation regions 102b is faster than that on the implantation regions 102b, and therefore multiple openings are formed on the implantation regions 102b. As the semiconductor layer 104 is grown to reach a thickness of about 2.5 μm to 3 μm, multiple scattering cavities 105a can be formed between the substrate 102 and the semiconductor layer 104 and on the ion implantation regions 102b, and the multiple scattering cavities 105a and the multiple micro-protrusions 107b can be formed alternately. The height H of the scattering cavity 105a, which is smaller than 1 μm, can be controlled by the depth d2 of the concave region 107a, and the category, dose and energy of the ions 9.

Fifth Embodiment

Figure 6A:
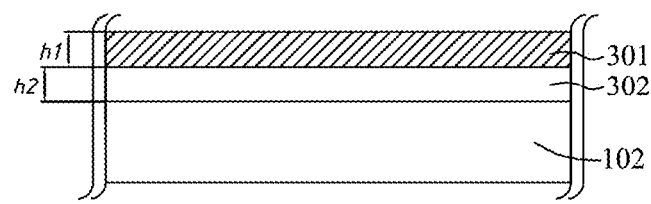
FIGS. 6A to 6E show a manufacturing method of a light-emitting device in accordance with a fifth embodiment of the present application.
Figure 6B:
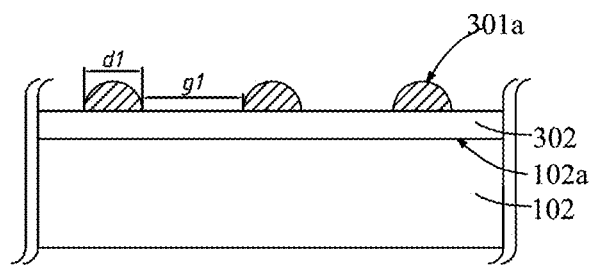
Figure 6C:
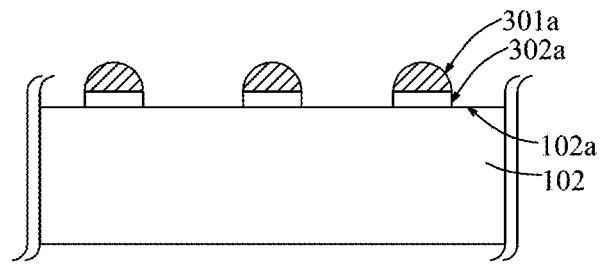
Figure 6D:
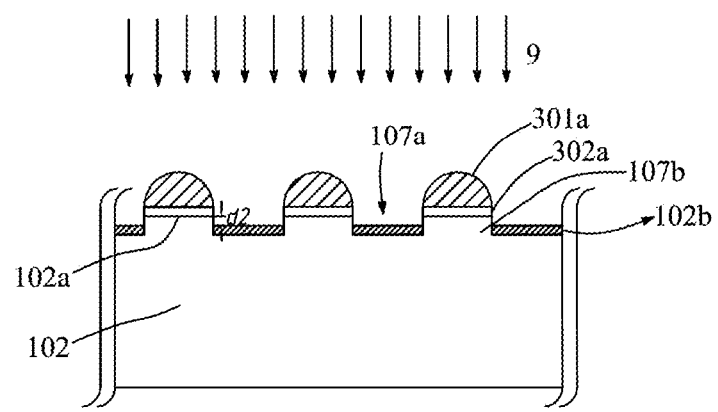
Figure 6E:
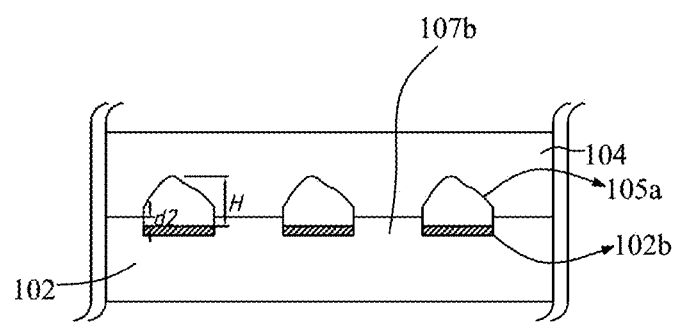

Referring to FIGS. 6A to 6E, a method of forming a plurality of scattering cavities between a substrate 102 and a semiconductor layer 104 in accordance with the fifth embodiment of the present embodiment is disclosed. As FIG. 6A shows, an oxide layer 302 is formed on an upper surface 102a of the substrate 102 by PVD or CVD, wherein the upper surface 102a is planar and the thickness of the oxide layer 302 is smaller than 500 nm. The oxide layer 302 comprises SiOx and has a thickness h2 smaller than 500 nm, or preferably between 50~150 nm. Then, a metal film 301 is formed on the oxide layer 302 by PVD or CVD. The material of the metal film 301 comprises Au, Ag, Ni, or Al, and the metal film 301 has a thickness h1 between 50~100 nm. As FIG. 6B shows, a heat treatment can be applied to the metal film 301 to form multiple metal particles 301a on the oxide layer 302 and reveal a portion of the oxide layer 302, wherein the heat treatment comprises heating the metal film 301 to 600~800° C., maintaining the metal film 301 in a temperature of 600~800° C. for about 30~60 seconds and cooling the metal film 301 to about 200° C. by using nitrogen gas. When the metal film 301 is heated, the molecules of the metal film 301 are attracted to each other due to the cohesive force and become semi-molten metal, which is able to form the multiple metal particles 301a. An interval g1 between any two of the neighboring metal particles 301a is smaller than 1 μm, and the particle size of the metal particle 301a is between 50~500 nm. The interval g1 between any two of the neighboring metal particles 301a and the particle size d1 of the metal particle 301a can be controlled by the period of maintaining the metal film 301 in the temperature of 600~800° C. As the period of maintaining the metal film 301 in the temperature of 600~800° C. is shorter, the interval g1 and the particle size d1 are smaller. As FIG. 6C shows, the portion of the oxide layer 302 exposed from the multiple metal particles 301a is removed by dry etching, such as ICP or RIE, or wet etching to form multiple oxide blocks 302a between the upper surface 102a and the multiple metal particles 301a. As FIG. 6D shows, the multiple oxide blocks 302a can act as a mask to an acid etching solution which is used for forming a concave region 107a on the portion of the upper surface 102a exposed therefrom, and the portion of the upper surface 102a under the multiple metal particles 301a forms multiple micro-protrusions 107b, wherein the acid etching solution comprises sulfuric acid, phosphoric acid or the combination thereof. The concave region 107a has a depth d2 preferably smaller than 30 nm, wherein the depth d2 can be controlled by the etching time. The multiple micro-protrusions 107b are randomly arranged over the upper surface 102a. And, the multiple metal particles 301a can act as a mask to ions 9 which are implanted to the concave region 107a to form ion implantation regions 102b therein. The ion can be Ar ion, Si ion, O ion, N ion, C ion and the combination thereof. As FIG. 6E shows, the multiple metal particles 301a and the multiple oxide blocks 302a are removed by wet etching and a semiconductor layer 104 is formed on the upper surface 102a by epitaxial growth. Because of the amorphization of the ion implantation regions 102b, the epitaxial growth rate on a region other than the implantation regions 102b is faster than that on the implantation regions 102b, and therefore multiple openings are formed on the implantation regions 102b. As the semiconductor layer 104 is grown to reach a thickness of about 2.5 μm to 3 μm, multiple scattering cavities 105a can be formed between the substrate 102 and the semiconductor layer 104 and on the ion implantation regions 102b, and the multiple scattering cavities 105a and the multiple micro-protrusions 107b can be formed alternately. The height H of the scattering cavity 105a, which is smaller than 1 μm, can be controlled by the depth d2 of the concave region 107a, and the category, dose and energy of the ions 9.

Sixth Embodiment

Figure 7A:
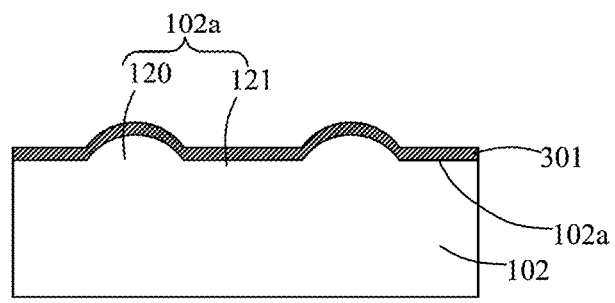
FIGS. 7A to 7E show a manufacturing method of a light-emitting device in accordance with a sixth embodiment of the present application.
Figure 7B:
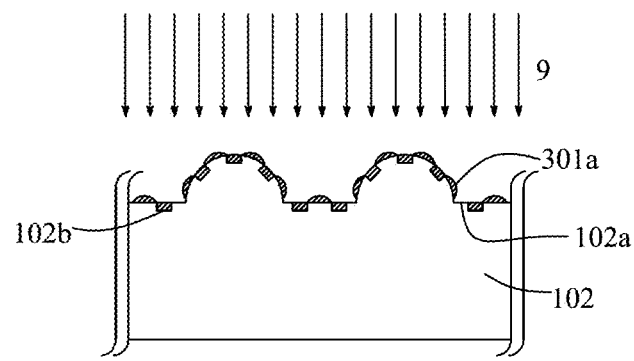
Figure 7C:
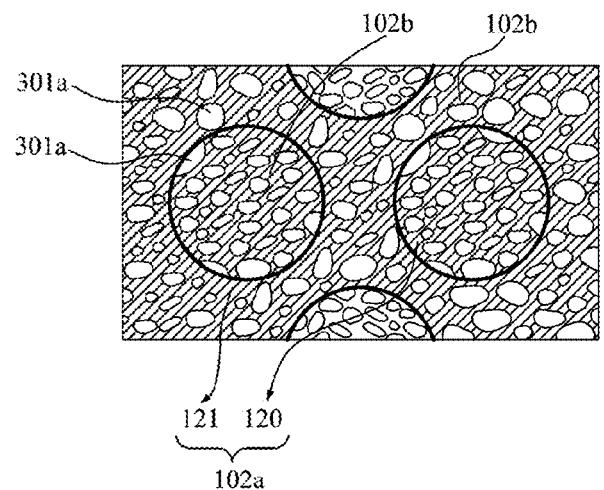
Figure 7D:
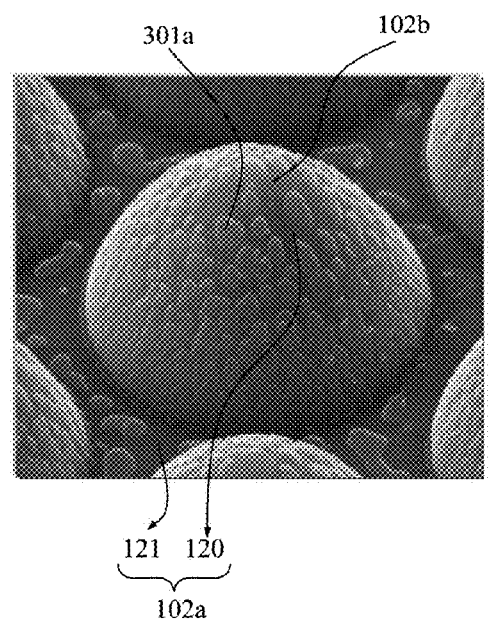
Figure 7E:
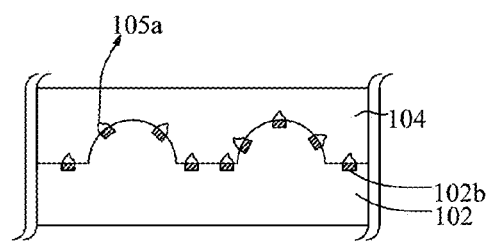

Referring to FIGS. 7A to 7E, a method of forming a plurality of scattering cavities between the substrate 102 and the semiconductor layer 104 in accordance with the sixth embodiment of the present embodiment is disclosed. The difference between the sixth embodiment and the above-mentioned third embodiment is that the upper surface 102a has a protruded part 120 comprising a plurality of protrusions and a planar part 121. The multiple protrusions of the protruded part 120 are periodically arranged over the upper surface 102a. As FIG. 7A shows, a metal film 301 is formed on an upper surface 102a. Then, as FIG. 7B shows, the heat treatment can be applied to the metal film 301 to form multiple metal particles 301a on the protruded part 120 and the planar part 121, wherein the heat treatment comprises heating the metal film 301 to 600~800° C., maintaining the metal film 301 in a temperature of 600~800° C. for about 30~60 seconds and cooling the metal film 301 to about 200° C. by using nitrogen gas. When the metal film 301 is heated, the molecules of the metal film 301 are attracted to each other due to the cohesive force and become semi-molten metal, which is able to form the multiple metal particles 301a. An interval between any two of the neighboring metal particles 301a is smaller than 1 μm, and the particle size of the metal particle 301a is between 50~500 nm. The interval between any two of the neighboring metal particles 301a and the particle size of the metal particle 301a can be controlled by the period of maintaining the metal film 301 in a temperature of 600~800° C. Next, ions 9 are implanted into the substrate 102. The multiple metal particles 301a can act as a mask to the ions 9 which are implanted to the portion of on the protruded part 120 and the planar part 121 exposed from the multiple metal particles 301a to form ion implantation regions 102b. FIG. 7C shows the top view of the multiple metal particles 301a arranged on a portion of the protruded part 120 and the planar part 121 and the ion implantation regions 102b exposed from the multiple metal particles 301a to form ion implantation regions 102b. FIG. 7D shows the scanning electron microscope (SEM) photo of the ion implantation regions 102b and the distribution of the multiple metal particles 301a on both of the protruded part 120 and the planar part 121 of the upper surface 102a. The multiple scattering cavities 105a can be formed on both of the protruded part 120 and the planar part 121.

Seventh Embodiment

Figure 8A:
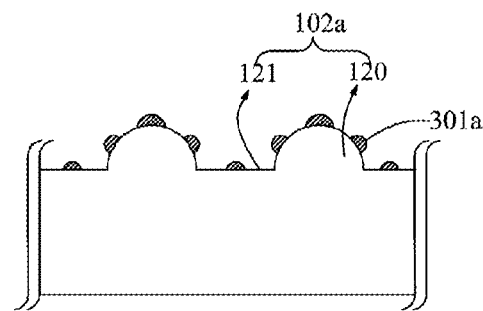
FIGS. 8A to 8C show a manufacturing method of a light-emitting device in accordance with a seventh embodiment of the present application.
Figure 8B:
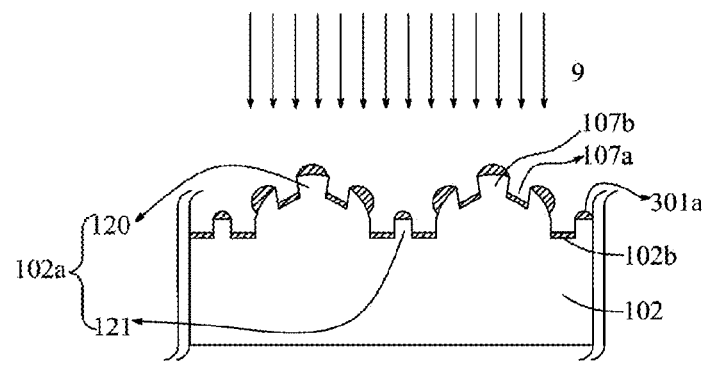
Figure 8C:
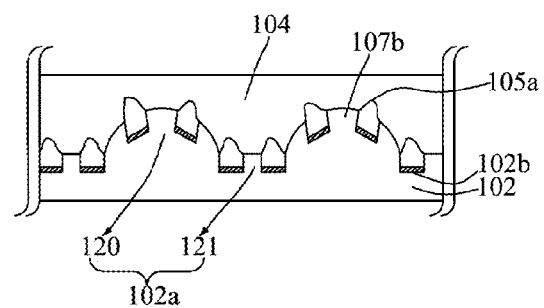

Referring to FIGS. 8A to 8C, a method of forming a plurality of scattering cavities between the substrate 102 and the semiconductor layer 104 in accordance with the seventh embodiment of the present embodiment is disclosed. The difference between the seventh embodiment and the above-mentioned fourth embodiment is that the upper surface 102a has a protruded part 120 comprising a plurality of protrusions and a planar part 121, wherein the multiple protrusions of the protruded part 120 are periodically arranged over the upper surface 102a, and the ion implantation regions 102b can be formed on both of the protruded part 120 and the planar part 121, and the multiple scattering cavities 105a can also be formed on both of the protruded part 120 and the planar part 121. As FIG. 8A shows, a metal film 301 is formed on the protruded part 120 and the planar part 121 by PVD or CVD. The material of the metal film 301 comprises Au, Ag, Ni, or Al, and the metal film 301 has a thickness between 50~100 nm. Then, as FIG. 8B shows, a heat treatment can be applied to the metal film 301 to form multiple metal particles 301a on the protruded part 120 and the planar part 121 and reveal a portion of the protruded part 120 and the planar part 121, wherein the heat treatment comprises heating the metal film 301 to 600~800° C., maintaining the metal film 301 in a temperature of 600~800° C. for about 30~60 seconds and cooling the metal film 301 to about 200° C. by using nitrogen gas. When the metal film 301 is heated, the molecules of the metal film 301 are attracted to each other due to the cohesive force and become semi-molten metal, which is able to form the multiple metal particles 301a. An interval between any two of the neighboring metal particles 301a is smaller than 1 μm, and the particle size of the metal particle 301a is between 50~500 nm. The interval between any two of the neighboring metal particles 301a and the particle size d1 of the metal particle 301a can be controlled by the period of maintaining the metal film 301 in the temperature of 600~800° C. As the period of maintaining the metal film 301 in the temperature of 600~800° C. is shorter, the interval and the particle size are smaller. As FIG. 8B shows, a concave region 107a between the metal particles 301a is formed by etching the portion of the protruded part 120 and the planar part 121 exposed from the multiple metal particles 301a, and the portion of the upper surface 102a under the multiple metal particles 301a forms multiple micro-protrusions 107b, wherein the etching process comprises dry etching, such as RIE and ICP, or wet etching. The concave region 107a has a depth usually smaller than 30 nm which can be controlled by the etching time. The multiple micro-protrusions 107b are randomly arranged over the upper surface 102a and a feature size of one of the protrusions of the protruded part 120 is at least two times of a feature size of one of the micro-protrusions 107b. And, ions 9 are implanted into the substrate 102, and the multiple metal particles 301a can act as a mask to the ions 9 which can be implanted to the portion of protruded part 120 and the planar part 121 exposed from the multiple metal particles 301a to form ion implantation regions 102b in the concave region 107a. The ion can be Ar ion, Si ion, O ion, N ion, C ion and the combination thereof. As FIG. 8C shows, the multiple metal particles 301a are removed by wet etching and a semiconductor layer 104 is formed on the upper surface 102a by epitaxial growth. Because of the amorphization of the ion implantation regions 102b, the epitaxial growth rate on a region other than the implantation regions 102b is faster than that on the implantation regions 102b, and therefore multiple openings are formed on the implantation regions 102b. As the semiconductor layer 104 is grown to reach a thickness of about 2.5 µm to 3 µm, multiple scattering cavities 105a can be formed between the substrate 102 and the semiconductor layer 104 and on the ion implantation regions 102b, and the multiple scattering cavities 105a and the multiple micro-protrusions 107b can be formed alternately.

Eighth Embodiment

Referring to FIGS. 9A to 9E, a method of forming a plurality of scattering cavities between the substrate 102 and the semiconductor layer 104 in accordance with the eighth embodiment of the present embodiment is disclosed. The difference between the eighth embodiment and the above-mentioned fifth embodiment is that the upper surface 102a has a protruded part 120 comprising a plurality of protrusions and a planar part 121, wherein the multiple protrusions of the protruded part 120 are periodically arranged over the upper surface 102a, both of the concave region 107a and the ion implantation regions 102b can be formed on both of the protruded part 120 and the planar part 121, and the multiple scattering cavities 105a can also be formed on both of the protruded part 120 and the planar part 121.

Figure 9A:
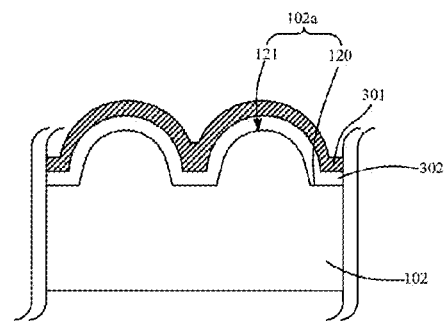
FIGS. 9A to 9E show a manufacturing method of a light-emitting device in accordance with an eighth embodiment of the present application.
Figure 9B:
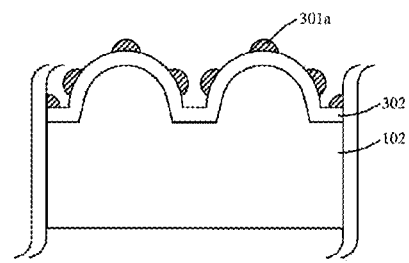
Figure 9C:
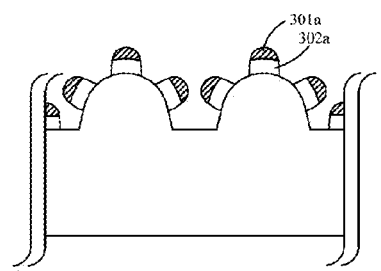
Figure 9D:
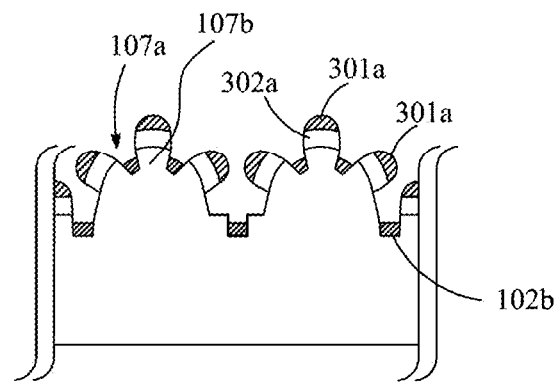
Figure 9E:
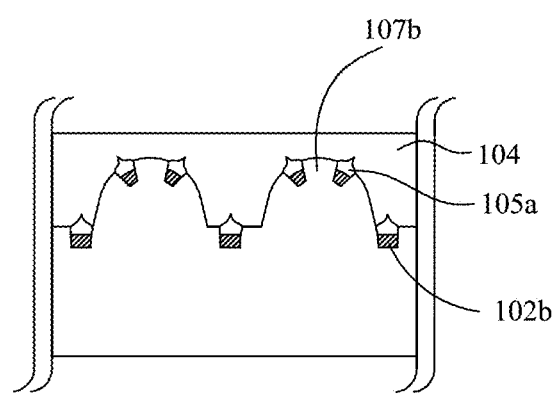

As FIG. 9A shows, an oxide layer 302 is formed on the protruded part 120 and the planar part 121 by PVD or CVD. The oxide layer 302 comprises SiOx and has a thickness smaller than 500 nm, or preferably between 50~150 nm. Then, a metal film 301 is formed on the oxide layer 302 by PVD or CVD. The material of the metal film 301 comprises Au, Ag, Ni, or Al, and the metal film 301 has a thickness between 50~100 nm. As FIG. 9B shows, a heat treatment can be applied to the metal film 301 to form multiple metal particles 301a on the oxide layer 302 and reveal a portion of the oxide layer 302, wherein the heat treatment comprises heating the metal film 301 to 600~800° C., maintaining the metal film 301 in a temperature of 600~800° C. for about 30~60 seconds and cooling the metal film 301 to about 200° C. by using nitrogen gas. When the metal film 301 is heated, the molecules of the metal film 301 are attracted to each other due to the cohesive force and become semi-molten metal, which is able to form the multiple metal particles 301a. An interval between any two of the neighboring metal particles 301a is smaller than 1 µm, and the particle size of the metal particle 301a is between 50~500 nm. The interval between any two of the neighboring metal particles 301a and the particle size of the metal particle 301a can be controlled by the period of maintaining the metal film 301 in the temperature of 600~800° C. As the period of maintaining the metal film 301 in the temperature of 600~800° C. is shorter, the interval and the particle size are smaller. As FIG. 9C shows, the portion of the oxide layer 302 exposed from the multiple metal particles 301a is removed by dry etching, such as ICP or RIE, or wet etching to form multiple oxide blocks 302a between the upper surface 102a and the multiple metal particles 301a. As FIG. 9D shows, the multiple oxide blocks 302a can act as a mask to an acid etching solution which is used for forming a concave region 107a on the portion of the upper surface 102a exposed therefrom, and the portion of the upper surface 102a under the multiple oxide blocks 302a forms multiple micro-protrusions 107b, wherein the acid etching solution comprises sulfuric acid, phosphoric acid or the combination thereof. The concave region 107a has a depth preferably smaller than 30 nm, wherein the depth can be controlled by the etching time. The multiple micro-protrusions 107b are randomly arranged over the upper surface 102a and a feature size of one of the protrusions of the protruded part 120 is at least two times of a feature size of one of the micro-protrusions 107b. And, the multiple metal particles 301a can act as a mask to ions 9 which are implanted to the concave region 107a to form ion implantation regions 102b therein. The ion can be Ar ion, Si ion, O ion, N ion, C ion and the combination thereof. As FIG. 9E shows, the multiple metal particles 301a and the multiple oxide blocks 302a are removed by wet etching and a semiconductor layer 104 is formed on the protruded part 120 and the planar part 121 by epitaxial growth. Because of the amorphization of the ion implantation regions 102b, the epitaxial growth rate on a region other than the implantation regions 102b is faster than that on the implantation regions 102b, and therefore multiple openings are formed on the implantation regions 102b. As the semiconductor layer 104 is grown to reach a thickness of about 2.5 µm to 3 µm, multiple scattering cavities 105a can be formed between the substrate 102 and the semiconductor layer 104 and on the ion implantation regions 102b, and the multiple scattering cavities 105a and the multiple micro-protrusions 107b can be formed alternately.

Ninth Embodiment

Figure 10A:
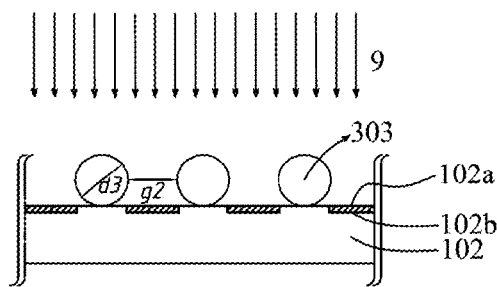
FIGS. 10A to 10D show a manufacturing method of a light-emitting device in accordance with a ninth embodiment of the present application.
Figure 10B:
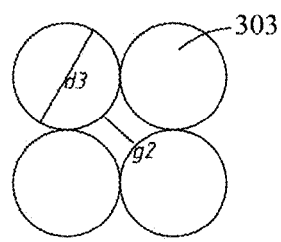
Figure 10C:
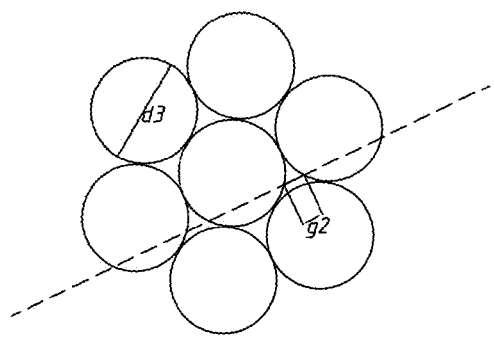
Figure 10D:
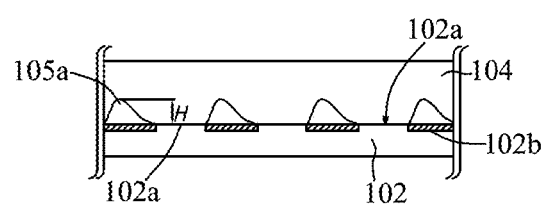

Referring to FIGS. 10A to 10C, a method of forming multiple scattering cavities between a substrate 102 and a semiconductor layer 104 in accordance with the ninth embodiment of the present embodiment is disclosed. As FIG. 10A shows, multiple oxide particles 303 are disposed on an upper surface 102a of the substrate 102. An interval g2 between any two of the neighboring oxide particles 303 is between 200~300 nm and the oxide particle 303 has a particle size d3 between 300~600 nm. The intervals g2 between the different oxide particles 303 can be the same or different. FIGS. 10B and 10C show the top view of the arrangements of the multiple oxide particles 303. Then, ions 9 are implanted into the substrate 102. The multiple oxide particles 303 can act as a mask to the ions 9 which are implanted to the portion of the upper surface 102a exposed from the multiple oxide particles 303 to form ion implantation regions 102b. The ion can be Ar ion, Si ion, O ion, N ion, C ion and the combination thereof. As FIG. 10D shows, the multiple oxide particles 303 can be removed by wet etching and the semiconductor layer 104 is formed on the upper surface 102a by epitaxial growth. Because of the amorphization of the ion implantation regions 102b, the epitaxial growth rate on a region other than the implantation regions 102b is faster than that on the implantation regions 102b, and therefore multiple openings are formed on the implantation regions 102b. As the semiconductor layer 104 is grown to reach a thickness of about 2.5 µm to 3 µm, multiple scattering cavities 105a can be formed between the substrate 102 and the semiconductor layer 104 and on the ion implantation regions 102b. The height H of the scattering cavity 105a, which is smaller than 1 μm, can be controlled by the category, dose and energy of the ions 9.

Tenth Embodiment

Figure 11A:
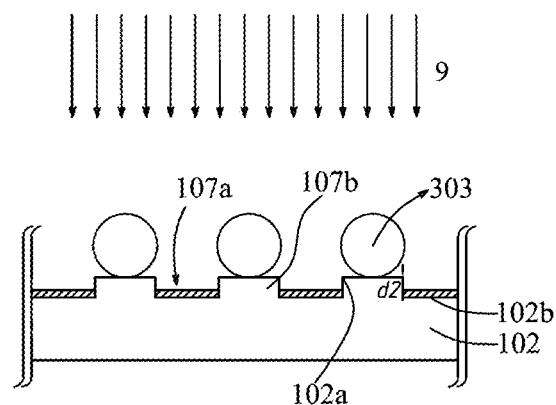
FIGS. 11A to 11B show a manufacturing method of a light-emitting device in accordance with a tenth embodiment of the present application.
Figure 11B:
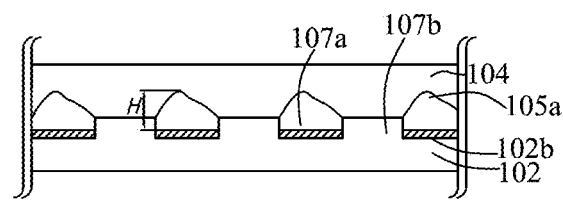

Referring to FIGS. 11A to 11B, a method of forming multiple scattering cavities between a substrate 102 and a semiconductor layer 104 in accordance with the tenth embodiment of the present embodiment is disclosed. The difference between the tenth embodiment and the above-mentioned ninth embodiment is that a concave region 107a between the oxide particles 303 is formed by etching the portion of the upper surface 102a exposed from the multiple oxide particles 303, and the portion of the upper surface 102a under the multiple oxide particles 303 forms multiple micro-protrusions 107b, wherein the etching process comprises dry etching, such as RIE and ICP. The concave region 107a has a depth d2 preferably smaller than 30 nm, wherein the depth d2 can be controlled by the etching time. The multiple micro-protrusions 107b are randomly arranged over the upper surface 102a. And, the multiple oxide particles 303 can act as a mask to ions 9 which are implanted to the concave region 107a to form ion implantation regions 102b therein. The ion can be Ar ion, Si ion, O ion, N ion, C ion and the combination thereof. As FIG. 11B shows, the multiple oxide particles 303 are removed by wet etching and a semiconductor layer 104 is formed on the upper surface 102a by epitaxial growth. Because of the amorphization of the ion implantation regions 102b, the epitaxial growth rate on a region other than the implantation regions 102b is faster than that on the implantation regions 102b, and therefore multiple openings are formed on the implantation regions 102b. As the semiconductor layer 104 is grown to reach a thickness of about 2.5 μm to 3 μm, multiple scattering cavities 105a can be formed between the substrate 102 and the semiconductor layer 104 and on the ion implantation regions 102b, and the multiple scattering cavities 105a and the multiple micro-protrusions 107b can be formed alternately. The height H of the scattering cavity 105a, which is smaller than 1 μm, can be controlled by the depth d2 of the concave region 107a, and the category, dose and energy of the ions 9.

Eleventh Embodiment

Figure 12A:
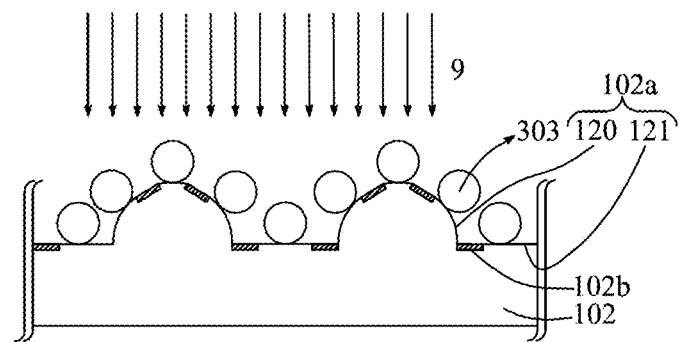
FIGS. 12A to 12B show a manufacturing method of a light-emitting device in accordance with an eleventh embodiment of the present application.
Figure 12B:
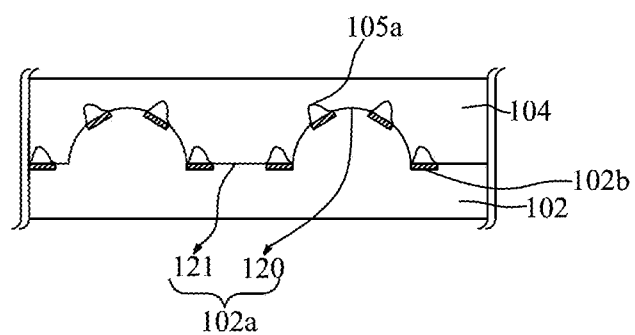

Referring to FIGS. 12A to 12B, a method of forming multiple scattering cavities between a substrate 102 and a semiconductor layer 104 in accordance with the eleventh embodiment of the present embodiment is disclosed. The difference between the eleventh embodiment and the above-mentioned ninth embodiment is that the upper surface 102a has a protruded part 120 comprising a plurality of protrusions and a planar part 121. The multiple protrusions of the protruded part 120 are periodically arranged over the upper surface 102a. The multiple oxide particles 303 can be disposed on both of the protruded part 120 and the planar part 121. The multiple oxide particles 303 can act as a mask to the ions 9 which are implanted to the portion of the upper surface 102a exposed from the multiple oxide particles 303 to form the ion implantation regions 102b. As FIG. 10B shows, the ion implantation regions 102b can be formed on both of the protruded part 120 and the planar part 121, and the multiple scattering cavities 105a can also be formed on both of the protruded part 120 and the planar part 121.

Twelfth Embodiment

Figure 13A:
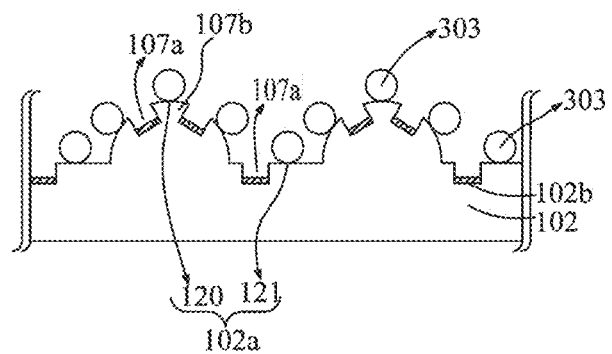
FIGS. 13A to 13B show a manufacturing method of a light-emitting device in accordance with a twelfth embodiment of the present application.
Figure 13B:
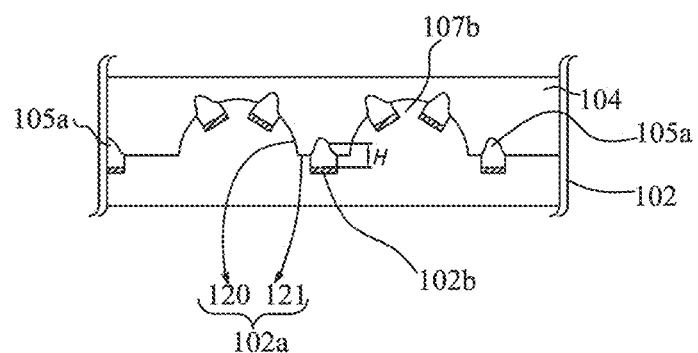

Referring to FIGS. 13A to 13B, a method of forming multiple scattering cavities between a substrate 102 and a semiconductor layer 104 in accordance with the twelfth embodiment of the present embodiment is disclosed. The difference between the twelfth embodiment and the above-mentioned tenth embodiment is that the upper surface 102a has a protruded part 120 comprising a plurality of protrusions and a planar part 121. The multiple protrusions of the protruded part 120 are periodically arranged over the upper surface 102a. The multiple oxide particles 303 can be disposed on both of the protruded part 120 and the planar part 121, and the concave region 107a and multiple micro-protrusions 107b can be formed on thereof. The multiple oxide particles 303 can act as a mask to the ions 9 which are implanted to the portion of the upper surface 102a exposed from the multiple oxide particles 303 to form the ion implantation regions 102b in the concave region 107a. As FIG. 13B shows, the multiple scattering cavities 105a can be formed on both of the protruded part 120 and the planar part 121, and the multiple scattering cavities 105a and the multiple micro-protrusions 107b can be formed alternately.

Although the present application has been explained above, it is not the limitation of the range, the sequence in practice, the material in practice, or the method in practice. Any modification or decoration for present application is not detached from the spirit and the range of such.

What is claimed is:

1. A method of manufacturing a light-emitting device, comprising:
   providing a substrate;
   forming a mask block contacting the substrate and exposing a portion of the substrate;
   implanting an ion into the portion of the substrate to form an ion implantation region; and
   forming a semiconductor stack on the substrate such that multiple cavities are formed between the semiconductor stack and the ion implantation region,
   wherein the mask block comprises a material made of metal or oxide, and
   wherein said forming the mask block comprises forming a metal film on the substrate and applying a heat treatment to the metal film to form multiple metal particles separated from each other.

2. The method of manufacturing a light-emitting device according to claim 1, further comprising removing the mask block by etching.

3. The method of manufacturing a light-emitting device according to claim 1, wherein a thickness of the metal film is smaller than 100 nm.

4. The method of manufacturing a light-emitting device according to claim 1, wherein a particle size of one of the multiple metal particles is between 50 nm and 500 nm, and a gap between neighboring two of the metal particles is smaller than 1 μm.

5. The method of manufacturing a light-emitting device according to claim 1, further comprising forming an oxide layer on the substrate before forming the metal film on the substrate.

6. The method of manufacturing a light-emitting device according to claim 5, wherein a thickness of the oxide layer is smaller than 500 nm.

7. The method of manufacturing a light-emitting device according to claim 1, wherein said forming the mask block comprises disposing multiple oxide particles on the substrate, and
   wherein a particle size of one of the multiple oxide particles between 300 nm and 600 nm, and a gap between neighboring two of the oxide particles is smaller than 1 μm.

8. The method of manufacturing a light-emitting device according to claim 1, further comprising forming a barrier section in the semiconductor stack.

9. The method of manufacturing a light-emitting device according to claim 8, wherein the barrier section is formed of non-crystalline material.

10. The method of manufacturing a light-emitting device according to claim 8, further comprising providing a MOCVD chamber,
   wherein semiconductor stack and the barrier section are formed in the MOCVD chamber.

11. The method of manufacturing a light-emitting device according to claim 8, wherein, after said forming the barrier section, said forming a semiconductor stack is resumed.

12. The method of manufacturing a light-emitting device according to claim 1, further comprising a seed layer before said forming a semiconductor stack on the substrate.

13. The method of manufacturing a light-emitting device according to claim 12, wherein the seed layer comprises AlN.

14. A method of manufacturing a light-emitting device, comprising:
   providing a substrate;
   forming a mask block contacting the substrate and exposing a portion of the substrate;
   etching the portion of the substrate to form a concave region in the substrate;
   implanting an ion into the portion of the substrate to form an ion implantation region corresponding to the concave region; and
   forming a semiconductor stack on the substrate such that multiple cavities are formed between the semiconductor stack and the ion implantation region,
   wherein the mask block comprises a material made of metal or oxide.

15. The method of manufacturing a light-emitting device according to claim 14, wherein the multiple cavities are on the concave region.

* * * * *